United States Patent [19]
Ho et al.

[11] Patent Number: 6,010,954
[45] Date of Patent: Jan. 4, 2000

[54] CMOS GATE ARCHITECTURE FOR INTEGRATION OF SALICIDE PROCESS IN SUB 0.1 μM DEVICES

[75] Inventors: Chaw Sing Ho; R. P. G. Karunasiri; Soo Jin Chua; Kin Leong Pey; Kong Hean Lee, all of Singapore, Singapore

[73] Assignees: Chartered Semiconductor Manufacturing, Ltd.; National University of Singapore, both of Singapore, Singapore

[21] Appl. No.: 09/156,359

[22] Filed: Sep. 18, 1998

[51] Int. Cl.[7] .......................... H01L 21/18; H01L 21/283; H01L 21/335; H01L 21/336; H01L 21/461
[52] U.S. Cl. .......................... 438/596; 438/592; 438/595; 438/303; 438/304; 257/344; 257/408
[58] Field of Search ..................... 438/592, 595, 438/596, 304, 303; 257/402, 433

[56] References Cited

U.S. PATENT DOCUMENTS

| | | | |
|---|---|---|---|
| 5,434,093 | 7/1995 | Chau et al. | 437/41 |
| 5,565,383 | 10/1996 | Sakai | 437/200 |
| 5,650,342 | 7/1997 | Satoh et al | 437/36 |
| 5,688,704 | 11/1997 | Liu | 437/41 |
| 5,710,450 | 1/1998 | Chau et al. | 257/344 |
| 5,726,081 | 3/1998 | Lin et al. | 438/163 |
| 5,731,239 | 3/1998 | Wong et al. | 438/296 |

*Primary Examiner*—Tom Thomas
*Assistant Examiner*—Bernard E. Souw
*Attorney, Agent, or Firm*—George O. Saile; Rosemary L.S. Pike; William J. Stoffel

[57] ABSTRACT

A method to form a "mushroom shaped" gate structure 18 22 44A 70 that increases the top gate silicide contact area and improves the salicide process, especially $TiSi_2$ salicide. The novel upper gate extensions 44A increase the top gate surface area so that the silicide gate contacts 70 will have a low resistivity. The invention includes forming a gate stack 18 22 26 comprised of a gate oxide layer 18, a center gate portion 22 and a hard mask 26. Next, we form a first insulating layer 40 over the gate stack 22 26 18. The hard mask 26 and a first thickness of the first insulating layer 40 are removed to expose sidewalls of the center gate portion 22. A second conductive layer 44 is formed over the first insulating layer 46 and the center gate portion 22. The second conductive layer 44 is etched to form critical rounded upper gate extensions 44A on the sidewalls of the center gate portion 22. Lower rectangular sidewall spacers 52 are formed on the sidewalls of the center gate portion 22. Source/drain regions 54 are formed. A salicide process forms silicide source/drain contacts 64 and forms extra large silicided gate contacts 70 to reduce parasitic resistance.

17 Claims, 4 Drawing Sheets

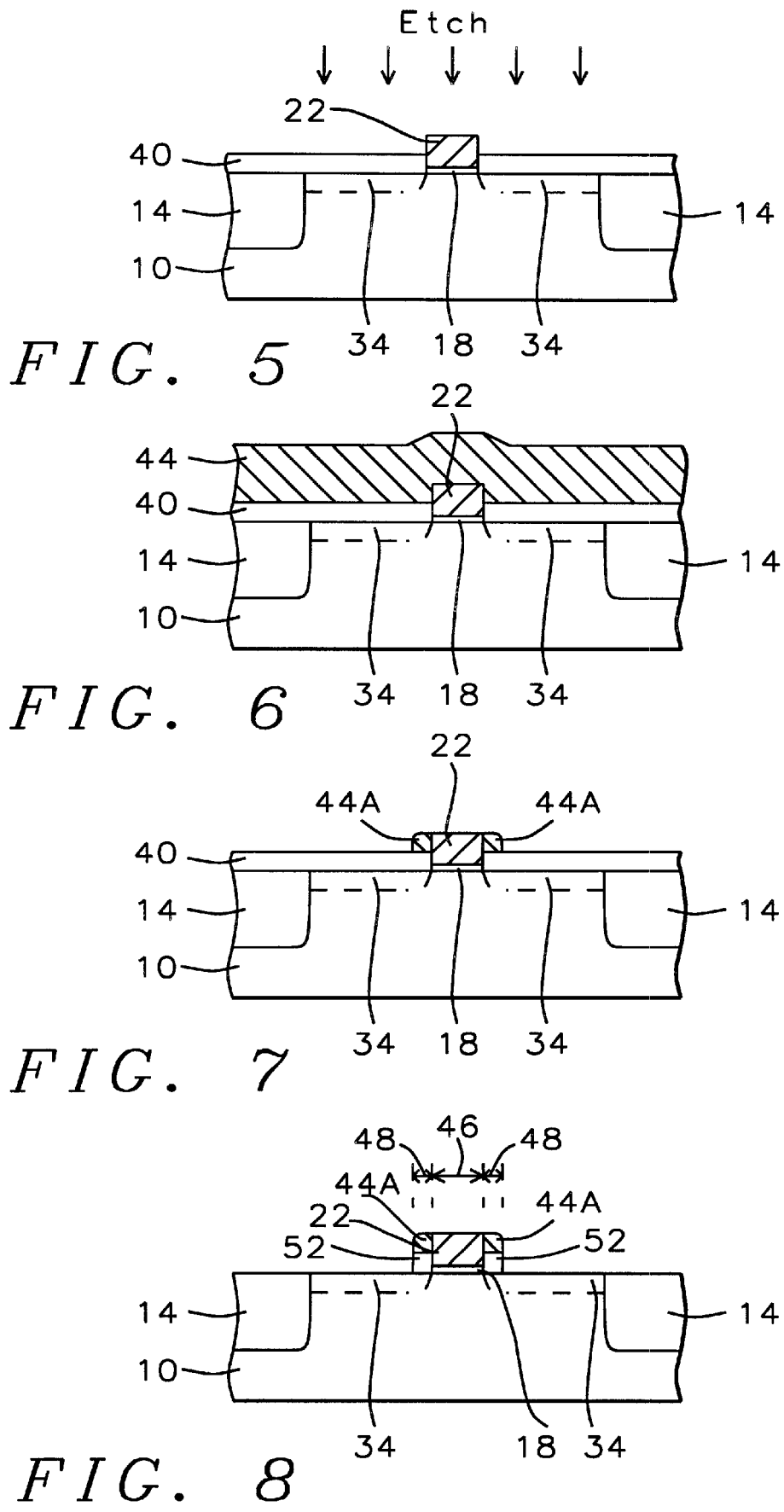

Sub 0.1 μM Devices

CMOS GATE ARCHITECTURE FOR INTEGRATION OF SALICIDE PROCESS IN SUB 0.1 μM DEVICES

BACKGROUND OF INVENTION

1) Field of the Invention

The present invention relates to the fabrication of integrated circuit devices on semiconductor substrates, and particularly to a method for forming gate structures for salicide processes, and more particularly relates to a method for making sub-quarter-micrometer gate electrodes having a "mushroom shape".

2) Description of the Prior Art

Advances in the semiconductor process technologies in recent years have dramatically decreased the device feature size and increased the circuit density and performance on integrated circuit chips. The field effect transistor (FET) is used extensively for Ultra Large Scale Integration (ULSI). These FETs are formed using polysilicon gate electrodes and self-aligned source/drain contact areas.

The conventional FETs are typically fabricated by patterning polysilicon gate electrodes over a thin gate oxide on a single crystal semiconductor substrate. The gate electrode structure is used as a diffusion or implant barrier mask to form self-aligned source/drain areas in the substrate adjacent to the sides of the gate electrode. The distance from the source junction to drain junction under the gate electrode is defined as the channel length of the FET.

Advances in semiconductor technologies, such as high resolution photolithographic techniques and anisotropic plasma etching, to name a few, have reduced the minimum feature sizes on devices to less than a quarter-micrometer. For example, FETs having gate electrodes with widths less than 0.25 micrometers (um), and channel lengths that are less than the gate electrode width are currently used in the industry.

However, as this downscaling continues and the channel length is further reduced, the FET device experiences a number of undesirable electrical characteristics. One problem associated with these narrow gate electrodes is the high electrical sheet resistance which impairs the performance of the integrated circuit. One method of circumventing this problem is to form on the gate electrode a metal silicide layer that substantially reduces the sheet resistance of the polysilicon gate electrode, and also the local electrical interconnecting lines made from the same polysilicon layer. A typical approach is to use a salicide process. In this process the polysilicon gate electrodes are patterned over the device areas on the substrate. Insulating sidewall spacers are formed on the sidewalls of the gate electrodes, and source/drain areas are implanted adjacent to the gate electrodes. Using the salicide process, a metal is deposited over the polysilicon gate electrodes and the self-aligned source/drain areas, and sintered to form a silicide layer on the polysilicon gates and silicide contacts in the source/drain areas. The unreacted metal on the insulating layer is selectively removed. Unfortunately, the formation of these salicide gate electrodes can result in undesirable effects, such as residual metal or silicide stringers extending over the narrow spacers causing electrical shorts between the gate electrodes and the source/drain areas.

A second problem, the inventors found, results from forming titanium silicide on sub-quarter-micrometer FETs. The problem is that it is difficult to form low sheet resistance silicide on these sub-0.25-micrometer (μm) gate lengths.

One method to circumvent this problem is to use a cobalt or a nickel silicide to replace the titanium silicide. U.S. Pat. No. 5,731,239 (Wong) (Assigned to same assignee) describes an alternative method to improve the sheet resistance is to amorphize the polysilicon layer by ion implantation prior to forming the titanium silicide.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,650,342 (Satoh) shows a T shaped gate. U.S. Pat. No. 5,434,093 (Chau) shows an inverted spacer transistor. U.S. Pat. No. 5,565,383 (Sakai) shows a gate and salicide process. U.S. Pat. No. 5,731,239 (Wong) shows a self-aligned silicide narrow gate process. U.S. Pat. No. 5,726,081 (Lin) shows a T shaped gate electrode. U.S. Pat. No. 5,710,450 (Chau) shows another salicide process. U.S. Pat. No. 5,688,704 (Liu) teaches a T shaped gate formed without a spacer process.

However, the sub 0.25 μm Salicide process can be further improved. Therefore, there is still a strong need in the semiconductor industry for making sub-quarter-micrometer gate electrodes having lower sheet resistance using improved silicide techniques, and for controlling manufacturing costs by reducing the number of photoresist masking steps and other processing steps.

SUMMARY OF THE INVENTION

It is therefore a principal object of this invention to form field effect transistors having sub-quarter-micrometer wide gate electrodes with reduced sheet resistance and silicide gate contacts.

It is another object of this invention to provide these low sheet resistance gate electrodes 22 44A so to have a "mushroom shape" so that the top of the gate has an increased surface area 46 48 and the center gate portion 22 has a narrow sub 0.1 μm width 46.

A further object of this invention is to form sub 0.25 μm field effect transistors having low sheet resistance gate electrodes using titanium silicide or cobalt silicide or nickel silicide.

It is still another object of the invention to reduce the number of photoresist masking steps and to simplify the process to provide a cost-effective manufacturing process.

It is an object of the invention to fabricate devices with high drive currents by shrinking device dimensions, at the same time achieving low gate RC (propagation) delay.

In accordance with the objects of the embodiments, the invention provides a method for fabricating improved field effect transistors (FETs) having Mushroom shaped gate structure 22 44A that increases the top gate silicide contact area and improves the SALICIDE process.

To accomplish the above objectives, the present invention provides a method of fabricating a "mushroom shaped" gate structure. The invention's novel upper gate extensions 44A increase the top gate surface area so that the silicide gate contacts 70 will have a low resistivity.

A gate stack 18 22 26 preferably comprised of a gate oxide layer 18, a center gate portion 22 and a hard mask 26 is formed over a substrate. (FIG. 2). An oxide liner 30 is preferably formed over the substrate. Lightly doped drains/sources (LDD) 34 are formed adjacent to the gate stack 18 22 26. The oxide liner 30 is used to reduce the implant range and damage due to the LDD implantation.

Next, we form a first insulating layer 40 over the semiconductor substrate and the gate stack 22 26 18. See FIG. 3. The next step chemical-mechanical polishes (CMP) the first insulating layer 40 and oxide liner 30 to expose the hard mask 26. (See FIG. 4). The hard mask 26 enhances the end-point detections for the CMP step. The hard mask 26 is removed, and a first thickness of the oxide liner 30 and first insulating layer 40 is etched to expose sidewalls of the center gate portion 22. (FIG. 5).

A second conductive layer 44 is formed over the first insulating layer 46 and the center gate portion 22. FIG. 6. The next step anisotropically etches the second conductive layer 44 to form critical rounded (e.g., hemispherical) upper gate extensions 44A on the sidewalls of the center gate portion 22. The rounded (e.g., hemispherical) upper gate extensions 44A and the center gate portion make up a "mushroom shaped" gate structure 22 44A. (FIG. 7).

The first insulating layer 40 is anisotropically etched using the rounded upper gate extensions 44A as an etch mask forming lower rectangular sidewall spacers 52 on the sidewalls of the center gate portion 22. Source/drain regions 54 are formed in the semiconductor.

A salicide process is performed to form silicide source/drain contacts 64 and to form extra large silicided gate contacts 70 to reduce parasitic resistance. Therefore, the "mushroom shaped" gate structure 18 22 44A 70 increases the top gate surface area so that the silicide gate contacts 70 will have a low resistivity due to the more uniform silicide. The salicide process preferably includes an ion amorphization step. The silicided source/drain contacts 64 and silicided gate contacts 70 are preferably composed of Titanium silicide ($TiSi_x$) or Cobalt silicide ($CoSi_x$).

BENEFITS OF THE UPPER GATE EXTENSIONS 44A

The invention provides the following benefits. The invention provides a method for fabricating improved field effect transistors (FETs) having Mushroom shaped gate structure 22 44A that increases the top gate silicide contact area and improves the Ti-SALICIDE process. The key idea is to increase the gate surface area for silicidation, regardless of what the gate dimensions scale down to. This will alleviate the starvation of C54-nucleation sites at the triple grain boundaries of the C49 polymorph as the gate length downsizes for the Ti-Salicide process. The invention's upper gate extensions 44A increase the gate top surface area for silicide contacts 70 while the center gate portion 22 maintains a narrow channel width in order to increase the device drive current.

The invention's new gate structure, reduces the "linewidth effect" observed for $TiSi_2$. The maturity of the $TiSi_2$ technology provides the extra impetus to discover new methods to extend its use for future devices into the next century. The line width effect is the non-linear increase in sheet resistance of silicide gate structure as the gate length shrinks. The reason for this is due to difficulty in fabricating uniform $TiSi_2$ films on gates with narrower geometries. This results in higher gate sheet resistance which exacerbates the higher gate RC delayed associated with deep sub-micron devices.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 through 11 are cross sectional views for illustrating a method for manufacturing a mushroom shaped gate structure and salicide process according to the present invention.

DETAILED DESCRIPTION OF THE PREFERRED EMBODIMENTS

The inventors have encountered problems with silicide gate contacts as the gate dimensions are decreased below the 0.25 $\mu$m size. Titanium has been widely used for salicidation since the 1 um generation. However, with shrinking geometries set to break the 0.2 um mark, conventional Ti-SALICIDE process has a major shortcoming due to a kinetic restriction imposed by the smaller gate lengths on the C49 to C54 polymorphic phase transformation. The inventors have found that the small gates do not have sufficient number of C54-nucleation sites at the triple grain boundaries of the C49 polymorph. The inventors requirement for ultra-shallow junctions means that thinner Ti film has to be used, which further exacerbates this kinetic difficulty of forming C54-$TiSi_2$. This places the use of TiSi2 for future sub-0.25 $\mu$m devices into doubt. A new method or architecture is thus needed if titanium silicide (TiSix) is to be extended for SALICIDE process in the next century. For the inventors, this motivation arises due to the technological maturity of Ti-Salicide process in the current manufacturing sector for CMOS device fabrication.

The present invention provides a method of for fabricating improved field effect transistors (FETs) having Mushroom shaped gate structure 22 44A that increases the top gate silicide contact 70 area and improves the Ti-SALICIDE process.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well know process have not been described in detail in order to not unnecessarily obscure the present invention. Note that all single value parameters in this specification have preferred limits of +/- 10% if a preferred range is not stated.

The method of the invention may be generally described as follows. The present invention provides a method of a "mushroom shaped" gate 33 44A.

Figure 1:
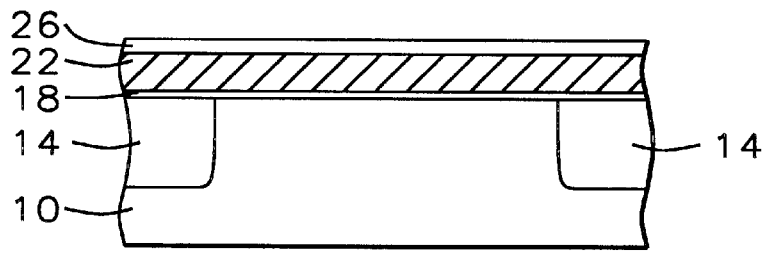

FIG. 1 shows the step of providing a semiconductor substrate 10. A gate oxide layer 18, a first conductive layer 22 and a hard mask layer 26 are formed over the substrate.

Figure 2:
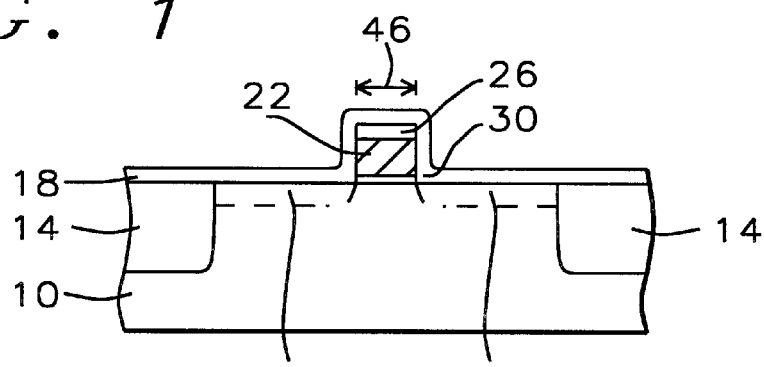

FIG. 2 shows the step of patterning the layers 18 22 26 to form a gate stack 18 22 26 comprised of a gate oxide layer 18, a center gate portion 22 and a hard mask 26. The center gate portion has sidewalls. The center gate portion is formed from a first conductive layer 22 preferably composed of polysilicon.

The hard mask 26 is preferably composed of a Silicon nitride, or boron nitride. The hard mask 26 preferably has a thickness in a range of between about 500 and 700 Å (tgt=600 Å). The center gate portion 22 preferably has a thickness in a range of between about 1800 and 2200 Å and a width less than about 0.1 µm.

An oxide liner 30 is then preferably formed over the substrate.

Next, lightly doped drains/sources (LDD) 34 are formed adjacent to the gate stack 18 22 26. The oxide liner 30 is used to reduce the implant range and damage due to the LDD implantation.

Figure 3:
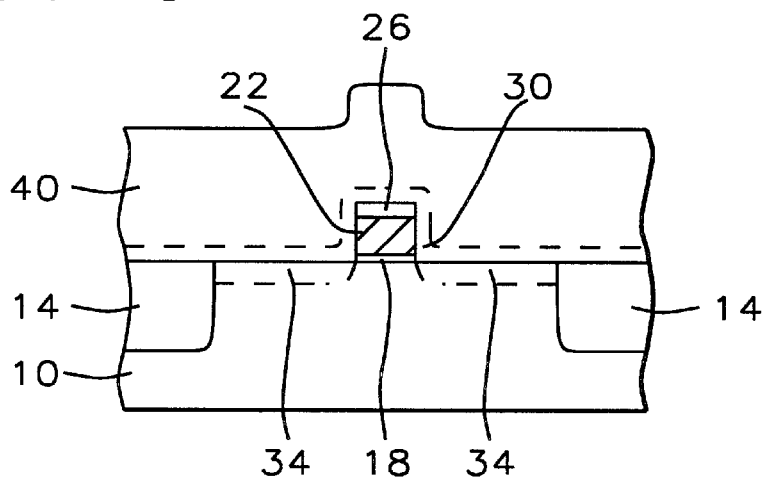

Referring to FIG. 3 a first insulating layer 40 is formed over the semiconductor substrate, the liner 30, and the gate stack 22 26 18.

Figure 4:
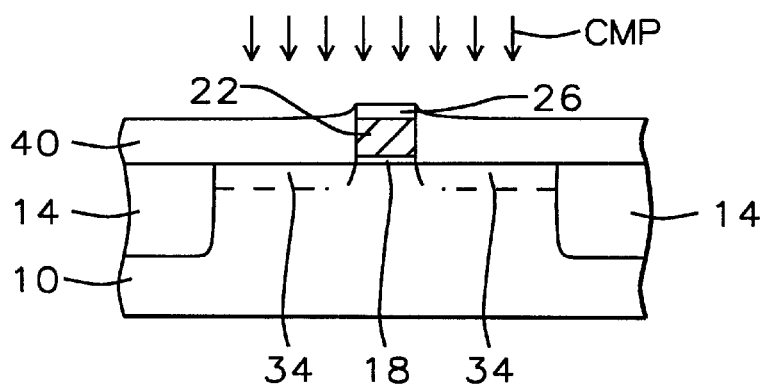

FIG. 4 shows the step of chemical-mechanical polishing the first insulating layer 40 to expose the hard mask 26. The hard mask 26 enhances the end-point detection for the chemical polishing step.

FIG. 5 shows the step of removing the hard mask and parts of the liner and etching a first thickness of the first insulating layer to expose sidewalls of the center gate portion 22.

FIG. 6 shows the step of forming a second conductive layer 44 over the first insulating layer 46 and the center gate portion 22. The second conductive layer is preferably composed of polysilicon.

FIG. 7 shows the step of etching the second conductive layer 44 to form rounded (e.g, hemispherical) upper gate extensions 44A on the sidewalls of the center gate portion 22. The rounded (e.g., hemispherical) upper gate extensions 44A and the center gate portion make up a "mushroom shaped" gate structure 22 44A. The rounded upper gate extensions 44A have a height in a range of between about 800 and 1000 Å and a width 48 (see FIG. 8) in a range of between about 900 and 1100 Å.

FIG. 8 shows the step of anisotropically etching the first insulating layer 40 using the rounded upper gate extensions as an etch mask forming lower rectangular sidewall spacers 52 on the sidewalls of the center gate portion 22. The rectangular spacers 52 preferably have a height in a range of between about 1000 and 1200 Å and preferably a width 48 between about 0.9 and 1.1 µm. The center portion 22 preferably has a width 46 less than 0.1 µm.

Figure 9:
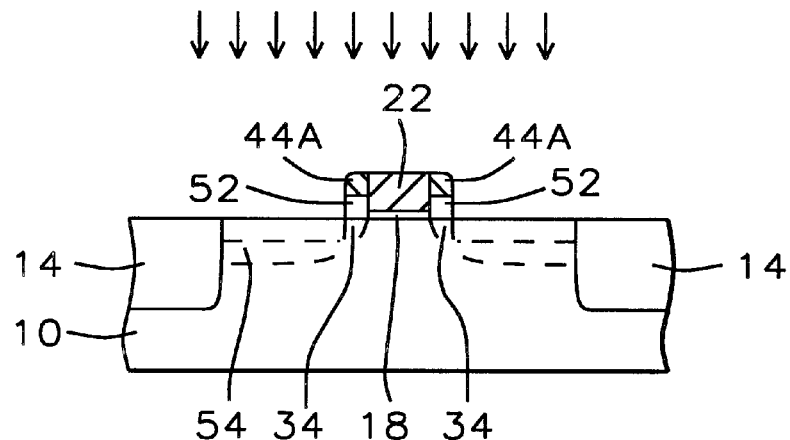

FIG. 9 shows the step of forming source/drain regions 54 in the semiconductor substrate. The S/D regions 54 can be formed by an implant process.

Figure 10:
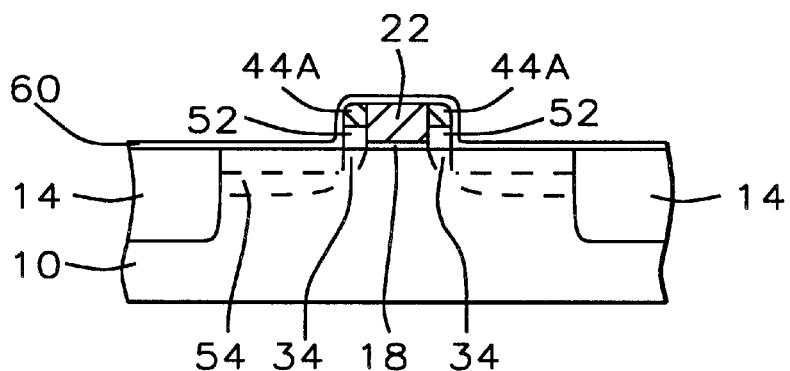
Figure 11:
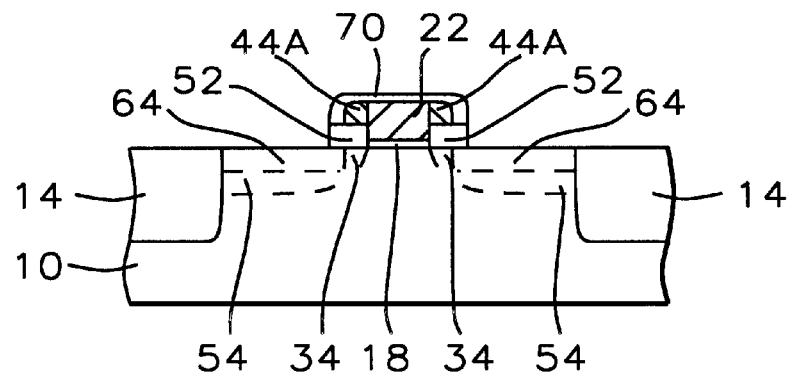

FIGS. 10 & 11 shows the step of performing a salicide process to form silicide source/drain contacts 64 and to form silicide gate contacts 70. In a salicide process (Self Aligned silicide), a metal layer is formed over the S/D regions, gate and gate sidewall spacers. The substrate is heated to form silicide S/D contacts and top gate contacts. The unreacted metal on the spacers is removed.

The "mushroom shaped" gate structure 44A 22 increases the top gate surface area so that the suicide gate contacts 70 will have a low resistivity. The salicide process preferably includes an ion amorphization step. The ion amorphization preferably comprises a I/I of Si or at a dose of between 4 E14 and 65E 14 atoms/cm$^2$ and at a power of between 14.5 and 15.5 Kev.

The silicide source/drain contacts 64 and to form silicide gate contacts 70 are preferably composed of Titanium silicide ($TiSi_2$), Nickel silicide (NiSi), Nickel (alloy) silicide (Ni(metal)Si) or Cobalt silicide ($CoSi_2$) and is most preferably composed of $TiSi_2$.

Figure 12:
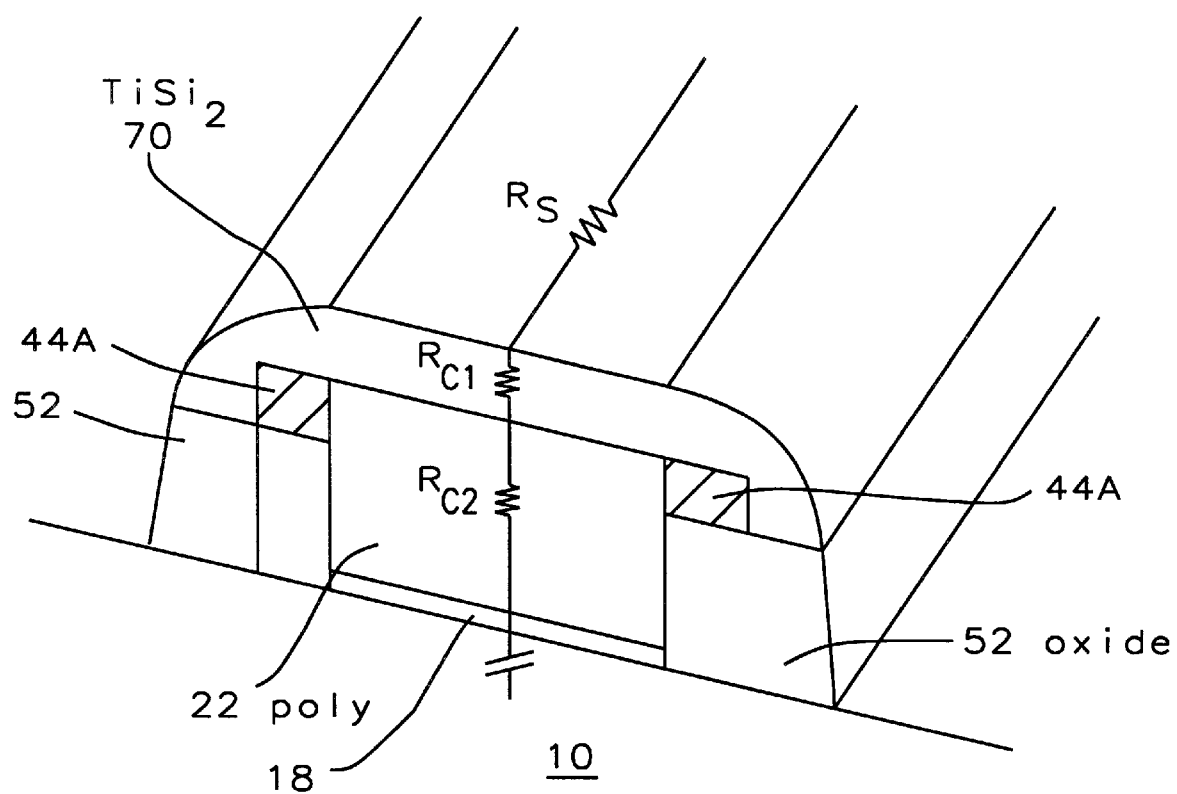
FIG. 12 is a three dimensional view of the invention's mushroom shaped gate structure showing the "line width effect" and the invention's upper gate extensions 44A that reduce the resistance.

FIG. 12 shows why the invention's gate extensions 44 reduces the parasitic resistance. The greater uniformity of the Silicide film 70 formed on the sub-0.1 µm polysilicon gate 22 provides lower resistance shunts path ($1/Rs=1/(R_{c1}+R_{c2})$) relative to the doped poly 22 alone for the current to pass through. Especially for $TiSi_2$, the high gate resistance comes into play more often since the current is not able to flow continuously in the silicide film. The invention's gate extensions 44a and the additional silicide area 70 reduce the resistance of the gate and give a larger surface area for the silicide (e.g., $TiSi_2$) to form.

EXAMPLE OF A PREFERRED EMBODIMENT

The following non-limiting examples represent preferred forms and best modes contemplated by the inventor for practice of his invention, as well as illustrating the results obtained through its use.

A preferred embodiment of the present invention is shown in FIGS. 1 to 11 and described below. The parameters listed below have plus or minus 10% (+/− 10%) preferred limits if limits are not stated.

As shown in FIG. 1, after the field oxide isolation 14 preferably in the form of STI (shallow trench isolation) and N-well and P-well (not shown) have been defined, a stack consisting of about 35 Å nitrided gate oxide 18, a first polysilicon layer 22 (e.g., LPCVD) (first conductive layer) with a thickness in a range of between about 1800 and 2200 Å (tgt=about 2000 Å), and an about 600 Å insulating hard mask 26, (i.e. $Si_xN_y$ or boron nitride) is deposited.

Referring to FIG. 2, using plasma etch, the gate stack is defined preferably with a line width 46 of ≦0.1 µm. Subsequently, a 200 Å oxide liner 30 is blanket deposited. A LDD implant through the oxide layer is then carried out to form (LDD) lightly doped source and drain regions 34.

Referring to FIG. 3, next, a layer of LPCVD TEOS oxide layer 40 (first insulating layer) is blanket deposited, preferably with a thickness between about 5500 and 6000 Å.

FIG. 4 shows the CMP (chemical mechanical polishing) step that is used to remove the excess TEOS oxide layer 40 above the gate stack 18 22 26. The insulating hard mask 26 on the poly-gate 22 is used as a CMP stop-layer to enhance the end-point detection of the CMP process. Some dishing is evident on the oxide layer 40 over the active or field oxide 14 with no underlying polysilicon gate 22.

Referring to FIG. 5, preferably using a 2-step etch process to strip the nitride hard mask 26. First, a plasma etch (that removes some oxide 40 and nitride 26) using either (a) conventional TCP $SF_6$/He (selectivity to thermal oxide is about 3:1) or (b) RIE $CF_4/CHF_3$/Ar (selectivity to thermal oxide is about 1:1) is performed. Second, a $H_3PO_4$ wet etch completely strips the nitride hard mask 26. The selectivity of nitride to thermal oxide for the wet-etch process is approximately greater than 5:1. Hence, some of the oxide layer 40 is also removed. Assuming a 500 Å nitride etch, about 200 Å of TEOS or thermal oxide 40 will be removed at the worst. An additional quick Dilute HF dip is used to ensure that the remaining TEOS layer 40 is uniform in thickness on the active and field oxide regions 14. Remaining TEOS oxide layer 40 thickness is preferably ensured to be about 1200 Å.

FIG. 6 shows a second polysilicon layer 44 with a thickness of about 1000 to 1200 Å is then blanket deposited.

FIG. 7 shows the important formation of the "mushroom shaped" gate structure 22 44A. Using an anisotropic RIE (reactive ion etching) step, the second polysilicon layer 44 is etched down to form a mushroom shaped (e.g., hemispherical shape) as shown in the FIG. 7. The extension of the gate top surface area will solve the common difficulty of siliciding gates with sub-quarter micron footprints ($L_{eff}$).

Referring to FIG. 8, the TEOS layer 40 is then preferably plasma etched down to the active and field regions 14. Rectangular-shaped spacers 52 are formed under the 2nd polysilicon layer (spacers) 44a as illustrated in FIG. 8. This mushroom-shaped gate structure 22 44A has a key advantage of increasing the gate top surface area (e.g., 46), which can reduce the line width effect often observed with $TiSi_2$, as well as that Of $CoSi2$ or even NiSi, especially for sub-0.1 $\mu$m . This structure has a tremendous advantage in that Ti-SALICIDE process can be scaled down even to sub-0.1 $\mu$m CMOS devices, extremely difficulty to achieve with the old architecture. In addition, due to the overhanging of the gate structure (e.g., extensions 44A) over the spacers, the parasitic resistance of the gate can be reduced thus resulting in reduction in device noise. This is especially true when the silicided polysilicon gate are used a local interconnects.

Referring to FIG. 9, the process proceeds with the conventional source/drain S/D junction formation 54, i.e. N+ and P+ implant and RTP (Rapid Thermal Processing) anneal.

Prior to the salicide metal deposition, an additional ion-amorphization step can be carried out to enhance the silicide formation, both on the gate 22 44A and active regions. The ion amorphization step involves ion implantation (I/I) of Si, As, or Ar ions into the gate and S/D regions at an energy between about 3E 14 and 6E 14 atoms/cm$^2$ and at an energy of about 15 Kev.

A SALICIDE process is subsequently carried out. A metal layer 60 preferably with a cap layer (not shown) is formed over the substrate surface and annealed to form silicide Source/Drain contacts 64 and gate contacts 70. Any silicide can be used, but $TiSi_2$ silicide is preferred in the salicide process.

A preferred SALCIDE process is described next. A pre-Ti clean using dilute HF (DHF) (about 100:1), followed by ion-amorphization, and high-temperature metal deposition i.e. 300/250 Å Ti/TiN stack 60 or 110/250 Å CoTiN stack 60 or 200/250 Å Ni/TiN or 200/250 Ni(metal) /TiN. (note: all single value parameters have preferred limits of +/− 10% if not listed separately).

For $TiSi_2$ 60, initial rapid thermal process (RTP) anneal at 720° C. for 30–60 seconds followed by selective etchback and a final RTP anneal at 850° C. for 10–30 seconds. In the case of $CoSi_2$, the RTP conditions are 550° C. for 30 seconds and 750° C. for about 10 to 30 seconds.

Ammonia peroxide mixture (1:1:5) is used for the removal of the TiN cap-layer during the selective etchback process. An additional $HCl:H_2O_2:H_2O$ (1:1:5) etch is usually conducted for $CoSi_2$ to remove any unreacted Co.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to than understanding of the present invention, exemplary technical data are set forth based upon current technology. Future developments in the art may call for appropriate adjustments as would be obvious to one skilled in the art.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a mushroom shaped gate structure comprising the steps of:

a) providing a semiconductor substrate;

b) forming a gate stack over semiconductor substrate; said gate stack comprised of a gate oxide layer, a center gate portion and a hard mask; said center gate portion having sidewalls; said center gate portion formed from a first conductive layer;

c) forming a first insulating layer over said semiconductor substrate and said gate stack;

d) removing portions of said first insulating layer to expose said hard mask;

e) removing said hard mask and etching a first thickness of said first insulating layer to expose sidewalls of said center gate portion;

f) forming a second conductive layer over said first insulating layer and said center gate portion;

g) etching said second conductive layer to form rounded upper gate extensions on said sidewalls of said center gate portion; whereby said rounded upper gate extensions and said center gate portion made up a mushroom shaped gate structure;

h) anisotropically etching said first insulating layer using said rounded upper gate extensions as an etch mask to form lower rectangular sidewall spacers on said sidewalls of said center gate portion.

2. The method of claim 1 which further includes:
   forming source/drain regions in said semiconductor substrate;
   performing a salicide process to form silicide source/drain contacts and to form a silicide gate contact.

3. The method of claim 1 which further includes:
   forming source/drain regions in said semiconductor substrate;
   performing a salicide process to form silicide source/drain contacts and to form a silicide gate contact; said salicide process comprises an ion amorphization step before a silicide formation step.

4. The method of claim 1 which further includes:
   forming source/drain regions in said semiconductor substrate;
   performing a salicide process to form silicide source/drain contacts and to form a silicide gate contact; said silicide source/drain contacts and said silicide gate contact are composed of a material selected from the group consisting of Titanium silicide ($TiSi_2$), nickel silicide (NiSi), Nickel alloy silicide (Ni(metal)Si) and Cobalt silicide ($CoSi_2$).

5. The method of claim 1 which further includes
   forming source/drain regions in said semiconductor substrate;
   performing a salicide process to form silicide source/drain contacts and to form a silicide gate contact; said silicide source/drain contacts and said silicide gate contact are composed of titanium silicide.

6. The method of claim 1 wherein after step (b) and before step (c); an oxide liner is formed over said semiconductor substrate and lightly doped source and drain regions are formed in said semiconductor substrate adjacent to said center portion.

7. The method of claim 1 wherein said hard mask is composed of a material selected from the group consisting of Silicon nitride, and boron nitride; said hard mask has a thickness in a range of between about 500 and 700 Å.

8. The method of claim 1 wherein said center gate portion having a thickness in a range of between about 1800 and 2200 Å and a width less than about 0.1 µm.

9. The method of claim 1 wherein said rounded upper gate extensions have a height in a range of between about 800 Å and 1000 Å and a width in a range of between about 900 and 1100 Å.

10. The method of claim 1 wherein said lower rectangular spacers have a height in a range of between about 1000 and 1200 Å; and a width between about 0.9 and 1.1 µm.

11. A method for fabricating field effect transistors having a mushroom shaped gate structure comprising the steps of:

a) providing a semiconductor substrate;

b) forming a gate stack comprised of a gate oxide layer, a center gate portion and a hard mask; said center gate portion having sidewalls; said center gate portion formed from a first conductive layer;

c) forming a first insulating layer over said semiconductor substrate and said gate stack;

d) chemical-mechanical polishing said first insulating layer to expose said hard mask;

e) removing said hard mask and etching a first thickness of said first insulating layer to expose sidewalls of said center gate portion;

f) forming a second conductive layer over said first insulating layer and said center gate portion;

g) etching said second conductive layer to form rounded upper gate extensions on said sidewalls of said center gate portion; whereby said rounded upper gate extensions and said center gate portion form a mushroom shaped gate structure;

h) anisotropically etching said first insulating layer using said rounded upper gate extensions as an etch mask forming lower rectangular sidewall spacers on said sidewalls of said center gate portion;

i) forming source/drain regions in said semiconductor substrate; and j) performing a salicide process to form silicide source/drain contacts and to form a silicide gate contact.

12. The method of claim 11 wherein said rounded upper gate extensions have a height in a range of between about 800 Å and 1000 Å and a width in a range of between about 900 and 1100 Å.

13. The method of claim 11 wherein said hard mask is composed of a material selected from the group consisting of Silicon nitride, and boron nitride; said hard mask has a thickness in a range of between about 500 and 700 Å; said center gate portion having a thickness in a range of between about 1800 and 2200 Å and a width less than about 0.1 µm.

14. The method of claim 11 wherein said lower rectangular spacers have a height in a range of between about 1000 and 1200 Å; and a width between about 0.9 and 1.1 µm.

15. The method of claim 11 wherein said salicide process comprises an ion amorphization step before a silicide formation step.

16. The method of claim 11 wherein said silicide source/drain contacts and silicide gate contact are composed of a material selected from the group consisting of Titanium silicide ($TiSi_2$), nickel silicide (NiSi), Nickel alloy silicide (Ni(metal)Si) and Cobalt silicide ($CoSi_2$).

17. The method of claim 11 wherein said silicide source/drain contacts and said silicide gate contact are composed of Titanium silicide.

* * * * *